(12) United States Patent
Park et al.

(10) Patent No.: US 6,274,914 B1
(45) Date of Patent: *Aug. 14, 2001

(54) CMOS INTEGRATED CIRCUITS INCLUDING SOURCE/DRAIN PLUG

(75) Inventors: Young-hoon Park, Kyungki-do; Yang-koo Lee, Seoul; Kyung-seok Oh, Kyungki-do, all of (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/855,024

(22) Filed: May 13, 1997

(30) Foreign Application Priority Data

May 15, 1996 (KR) .............................. 1996-16261

(51) Int. Cl.[7] ...................................... H01L 29/80
(52) U.S. Cl. ........................................... 257/371; 257/372
(58) Field of Search ...................... 257/336, 372, 257/504, 509, 371, 311

(56) References Cited

U.S. PATENT DOCUMENTS

| | | | |
|---|---|---|---|
| 3,920,481 | 11/1975 | Hu | 148/1.5 |
| 4,395,723 * | 7/1983 | Harari | 257/260 |
| 4,549,198 | 10/1985 | Kondo | 357/42 |
| 4,905,073 * | 2/1990 | Chen et al. | 257/371 |
| 5,334,870 | 8/1994 | Katada et al. | 257/371 |
| 5,413,945 | 5/1995 | Chien et al. | 437/35 |

OTHER PUBLICATIONS

Search Report, GB 9709785.1, Jul. 22, 1997.

* cited by examiner

Primary Examiner—Olik Chaudhuri
Assistant Examiner—Douglas A. Wille
(74) Attorney, Agent, or Firm—Myers Bigel Sibley & Sajovec

(57) ABSTRACT

A CMOS integrated circuit includes an NMOS transistor and a PMOS transistor in an integrated circuit substrate. The NMOS transistor and the PMOS transistor each include a gate, and a source/drain on opposing sides of the gate. An insulating layer is located on the integrated circuit substrate. The insulating layer includes a contact hole therein which exposes a portion of a corresponding one of the source/drains. A source/drain plug is formed in the corresponding one of the source/drains. The source/drain plug is of opposite conductivity from the corresponding one of the source/drains. The source/drain plug is centered about the portion of the corresponding one of the source/drains. The source/drain plug may be formed by ion implantation through the contact hole and is thereby self-aligned to the contact hole. The source/drain plug can compensate for misalignment and the diffusion for highly integrated CMOS devices.

24 Claims, 6 Drawing Sheets

US 6,274,914 B1

CMOS INTEGRATED CIRCUITS INCLUDING SOURCE/DRAIN PLUG

FIELD OF THE INVENTION

This invention relates to microelectronic devices and fabrication methods therefor, and more particularly to CMOS integrated circuits and fabrication methods therefor.

BACKGROUND OF THE INVENTION

CMOS integrated circuits are widely used for logic, memory, microprocessor and other microelectronic devices. As is well known to those having skill in the art, CMOS integrated circuits include insulated gate field effect transistors of complementary conductivity types, often referred to as NMOS transistors and PMOS transistors, on a single integrated circuit. Although the acronym MOS actually stands for metal oxide silicon, it will be understood that this term as used herein refers to any insulated gate field effect transistor.

As the integration density of integrated circuit devices continues to increase, it may become more difficult to ensure that CMOS devices can be reliably manufactured. For example, as the integration density of an integrated circuit device increases, and the design rules for fabricating the integrated circuit device continue to decrease, the size of a contact hole may extend into submicron dimensions. With such small dimensions, it may become difficult to ensure adequate overlap margins and reliable fabrication methods. Accordingly, there continues to be a need for CMOS integrated circuits and fabrication methods which can reduce the likelihood of overlap between regions thereof, notwithstanding decreasing device dimensions.

FIG. 1 is a schematic plan view of a conventional CMOS integrated circuit. Referring to FIG. 1, reference numerals P1 and P2 denote mask patterns for forming N-type and P-type active regions respectively. P3 and P4 denote mask patterns for forming the gates of NMOS and PMOS transistors, respectively. P5 and P6 denote mask patterns for forming contact holes connecting the source/drains of the NMOS or PMOS transistors to a wiring layer, respectively. Reference 1 denotes the distance between semiconductor devices, x1 denotes the overlap margin between a gate and a contact hole, and x2 and y denote overlap margins of an active region with respect to a contact hole in the direction of the x and y axis, respectively.

The decrease in design rules due to high integration of integrated circuit devices may cause a decrease of the overlap margin between an active region and a contact hole. Moreover, the x1, x2, and y values may decrease to under 0.1 $\mu$m for a DRAM of over 64 Mbits.

Techniques have been proposed in attempts to overcome these problems. For example, the contact hole size may be reduced to thereby improve overlap margin. The distance between integrated circuit devices may be decreased, allowing more space for contact holes. The overlap margin (x1) between a gate and a contact hole or the overlap margins (x2, y) of the active region may also be decreased.

Unfortunately, these techniques may require a misalignment of less than 0.1 $\mu$m, which may make it difficult to adopt these techniques for high volume fabrication. Moreover, decreasing contact hole size may also increase the contact resistance, which may deteriorate device operating speed. The aspect ratio of a contact hole may also increase, which may make it difficult to fill the contact hole.

FIGS. 2A through 2D are cross-sectional views showing a conventional manufacturing method of a CMOS integrated circuit whose NMOS source/drain includes a lightly doped drain (LDD) structure. Referring to FIG. 2A, a field oxide 4 for separating active regions and inactive regions is formed on the surface of an integrated circuit substrate such as a semiconductor substrate 2, and then an N-well 6 and a P-well are formed using a conventional well forming process. A gate insulating layer 8 is then formed on the substrate 2, and impurity-doped polysilicon is deposited thereon and patterned to form a gate electrode 10.

Referring to FIG. 2B, a low concentration of N-type impurity ions are implanted into the semiconductor substrate 2 using the gate electrode 10 as a mask, in order to form an N$^-$ source/drain 12. This implant step generally is not limited to the NMOS transistor area in order to reduce the number of process steps. As a result, the P$^-$ source/drain 14 in the N-well 6 can suppress short channel effects of the PMOS transistor.

An insulating material then is deposited on the substrate 2 and is patterned in order to form an insulating layer 16. Then, a high concentration of impurity ions are implanted into the NMOS and PMOS transistor areas of the semiconductor substrate using the insulating layer 16 and photoresist patterns for NMOS and PMOS (not shown in the FIG. 2B) as a mask, in order to form a N$^+$ source/drain 18 and P$^+$ source/drain 19.

Referring to FIG. 2C, an inter-layer insulating layer 20 having a predetermined thickness is formed by depositing an insulating material such as a high temperature oxide (HTO) on the substrate. Then, contact holes 22 for connecting the source/drains of the NMOS and PMOS transistors to a wiring layer are formed by selectively removing the inter-layer-insulating layer 20.

Referring to FIG. 2D, a wiring layer 24 is formed by depositing and patterning a conductive material on substrate. The wiring layer 24 electrically contacts the source/drain regions to complete the CMOS structure.

The LDD structure has been used in NMOS transistors to improve reliability. The LDD structure is now often employed in PMOS transistors as well. When device dimensions were larger, it generally was easier to use the LDD structure in the N$^-$ or P$^-$ source/drains because the distance between CMOS devices was large enough. However, as CMOS devices become more highly integrated, and the margin between the N$^-$ source/drain and the P-well, or between the P$^-$ source/drain and the N-well, has generally decreased to under 1 $\mu$m, a mere 0.15 $\mu$m misalignment of the N-well or P-well can affect operation of the CMOS devices.

Defects in CMOS devices due to the decreased distance between devices will be described below with reference to FIGS. 3, 3A, 4, and 4A. FIG. 3 is a cross-sectional view showing the N$^-$ source/drain of a CMOS transistor electrically connected to the N-well thereof, which generally causes malfunction of the CMOS device. FIG. 3A is an enlarged magnified view of the marked portion shown in FIG. 3.

Referring to FIG. 3, the N-type impurities implanted in the N$^-$ source/drain 12 of the NMOS transistor, or in the N-well 6, are diffused in the lateral direction by subsequent thermal processes. As a result, the N$^-$ source/drain 12 may come into contact with the N-well 6.

In particular, if the impurity concentration in the N$^-$ source/drain is $2.0 \times 10^{13}$ ion/cm$^2$ and the implantation energy is 30 KeV, annealing at 850° C. after forming the N$^-$ source/drain may cause the impurities in the N$^-$ source/drain to diffuse toward the N-well 6 by 0.25 $\mu$m. Thus, when the distance 1 between semiconductor devices (see FIG. 1) is 1.0 μm, such diffusion may encompass one fourth of the process margin. Moreover, if the N-well also includes impurities with concentration of $2.0 \times 10^{13}$ ion/cm$^2$ therein, the impurities in the N-well may diffuse toward the N source/drain by 0.25 μm during a subsequent anneal. Thus, when the impurities in the N$^-$ source/drain 12 and the N-well 6 are diffused at the same time, causing the distance therebetween to decrease to 0.5 μm, the N$^-$ source/drain and the N-well may come into contact with each other. When the N$^-$ drain is the output terminal $V_{OUT}$ and the voltage of the N$^+$ region providing well bias to the N-well is $V_{DD}$, the output voltage $V_{OUT}$ is equal to $V_{DD}$. Thus, improper operation may occur.

FIG. 4 is a cross-sectional view showing misalignment of the P$^+$ source/drain of a CMOS transistor which can cause malfunction of CMOS devices. FIG. 4A is a enlarged view of the marked portion shown in FIG. 4.

Referring to FIGS. 4 and 4A, when P-type ions are implanted for forming the P$^+$ source/drain at a high concentration after the implantation of N-type ions at a low concentration into the NMOS and PMOS transistors, P$^+$ source/drain misalignment may prevent the P-type ions from completely compensating for the implanted N-type ions. Thus, when the wiring layer is formed thereon and voltage is supplied thereto, the remaining N$^-$ source/drain 12 may contact the N-well 6. Thus, the back bias voltage $V_{BB}$ of the NMOS transistor may be combined with $V_{DD}$ of the PMOS transistor. A mere 0.1 μm misalignment of the P$^+$ domain can cause malfunction of a CMOS device and degrade the reliability thereof. Accordingly, there is a need for CMOS integrated circuit structures and fabrication methods which can be highly integrated without undue reliability concerns.

SUMMARY OF THE INVENTION

It is therefore an object of the present invention to provide improved CMOS integrated circuits and fabrication methods therefor.

It is another object of the present invention to provide CMOS integrated circuits and fabricating methods which can allow highly integrated devices to be fabricated without undue reliability concerns.

It is yet another object of the present invention to provide CMOS integrated circuit devices and fabricating methods which can provide adequate overlap margins notwithstanding shrinking device sizes.

These and other objects are provided according to the present invention by CMOS integrated circuits which include at least one source/drain plug of opposite conductivity from a corresponding source/drain and centered about the corresponding source/drain. The source/drain plug can shield the source/drain from the adjacent well, notwithstanding process margins and shrinking device sizes.

In particular, CMOS integrated circuits according to the invention include an integrated circuit substrate, and an NMOS transistor and a PMOS transistor in the integrated circuit substrate. The NMOS transistor and the PMOS transistor each include a gate, and a source/drain on opposing sides of the gate. An insulating layer is included on the integrated circuit substrate. The insulating layer includes a contact hole therein. The contact hole exposes a portion of a corresponding one of the source/drains. A source/drain plug is included in the corresponding one of the source/drains. The source/drain plug is of opposite conductivity from the corresponding one of the source/drains, and is centered about the portion of the corresponding one of the source/drains. A wiring layer is located in the contact hole and is electrically connected to the source/drain plug.

A second contact hole may also be included in the insulating layer to expose a portion of the corresponding second one of the source/drains. A second source/drain plug may be included in the corresponding second one of the source/drains. The second source/drain plug is of opposite conductivity from the corresponding second one of the source/drains, and is centered about the portion of the corresponding second one of the source/drains. A second wiring layer is located in the second contact hole, electrically connected to the second source/drain plug.

It will be understood that the two source/drain plugs may be formed in a source region and a drain region respectively of the NMOS transistor or the PMOS transistor. Alternatively, the source/drain plugs may be formed in a source/drain of the NMOS transistor and a source/drain of the PMOS transistor respectively. Alternatively, all of the source/drains of the NMOS and PMOS transistors may include a source/drain plug. Any or all of the source/drains may include lightly doped and heavily doped regions. For example, the corresponding one of the source/drains may comprise a first source/drain and a second source/drain within the first source/drain. The first and second source/drains are doped same conductivity type and the first source/drain is lightly doped relative to the second source/drain.

It will also be understood that the PMOS and/or NMOS transistors may be formed in wells of opposite conductivity type from the corresponding source/drains. Thus, for example, the source/drain plug may be a P-type source/drain plug, which is formed in a source/drain of an NMOS transistor. The NMOS transistor may include an N$^-$-type source/drain, and an N$^+$-type source/drain within the N$^-$-type source/drain.

It will also be understood that not all of the source/drain plugs need be of opposite conductivity type from the corresponding source/drain. Rather, at least one of the source/drain plugs may be of opposite conductivity type from the corresponding source/drain, but other source/drain plugs may be of the same conductivity type as the corresponding source/drain.

CMOS integrated circuit fabricating methods according to the invention form a source/drain plug through a contact hole in an insulating layer, into a corresponding source/drain. The source/drain plug is of opposite conductivity from the corresponding source/drain.

In particular, an NMOS transistor and a PMOS transistor are formed in an integrated circuit substrate. The NMOS transistor and the PMOS transistor each include a gate, and a source/drain on opposing sides of the gate. An insulating layer is formed on the integrated circuit substrate, and includes a contact hole therein. The contact hole exposes a portion of a corresponding one of the source/drains. A source/drain plug is formed through the contact hole into the corresponding one of the source/drain. The source/drain plug is of opposite conductivity from the corresponding one of the source/drain. A wiring layer is then formed in the contact hole, electrically connected to the source/drain plug. The source/drain plug is preferably formed by implanting ions of opposite conductivity from the corresponding one of the source/drains through the contact hole into the corresponding one of the source/drains.

The NMOS transistor and PMOS transistor may be fabricated by forming an N-well and a P-well in an integrated circuit substrate and forming a respective insulated gate electrode on the N-well and on the P-well. P-type source/drains are formed in the N-well on opposing sides of the insulated gate electrode on the N-well. N-type source/drains are formed in the P-well, on opposing sides of the insulated gate electrode on the P-well. The source/drains may include lightly doped and heavily doped source/drains. Multiple contact holes may be formed and multiple plugs may be formed, as was already described. Accordingly, the plugs may shield the source/drain from the adjacent well so that highly integrated devices may be formed.

DETAILED DESCRIPTION OF PREFERRED EMBODIMENTS

Figure 1:
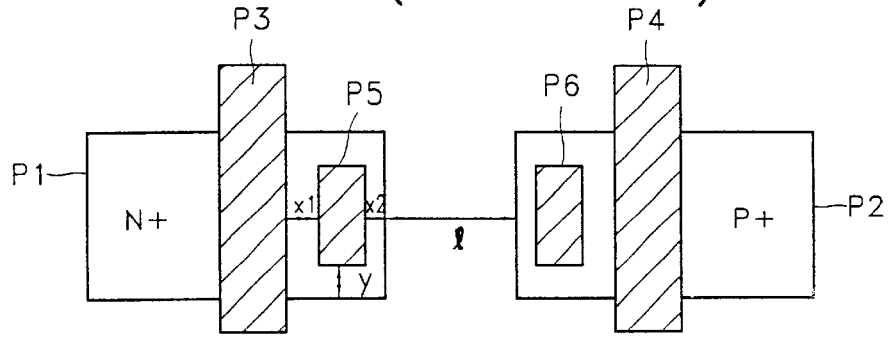
FIG. 1 is a schematic plan view of a conventional CMOS integrated circuit.
Figure 2A:
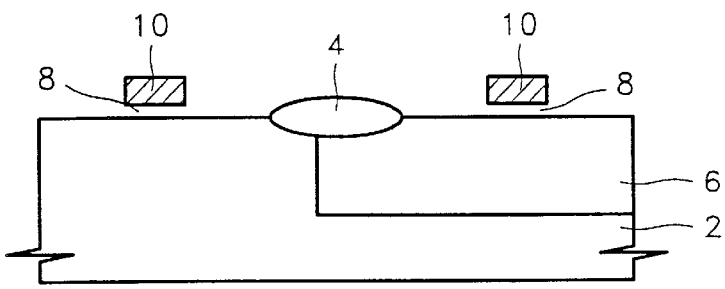
FIGS. 2A through 2D are cross-sectional views showing a fabricating process for a conventional CMOS integrated circuit.
Figure 2B:
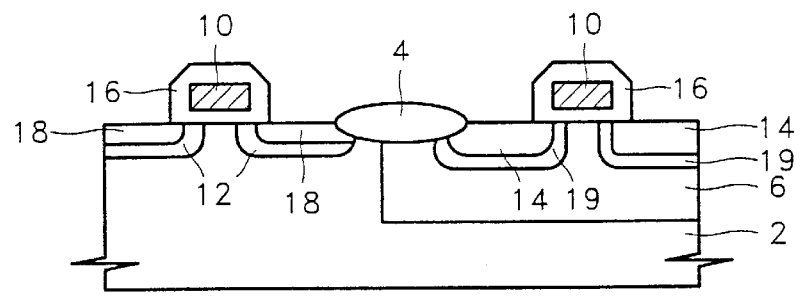
Figure 2C:
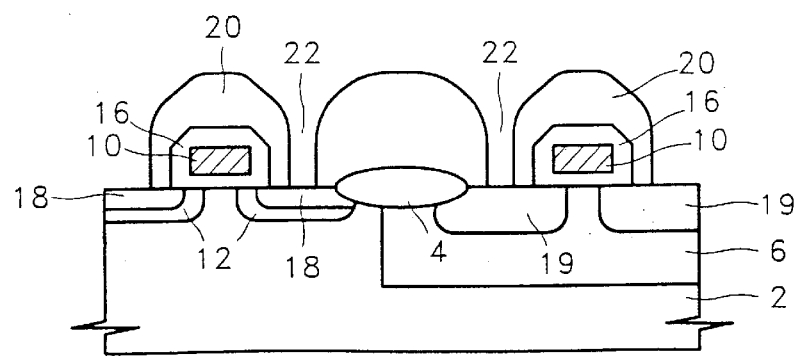
Figure 2D:
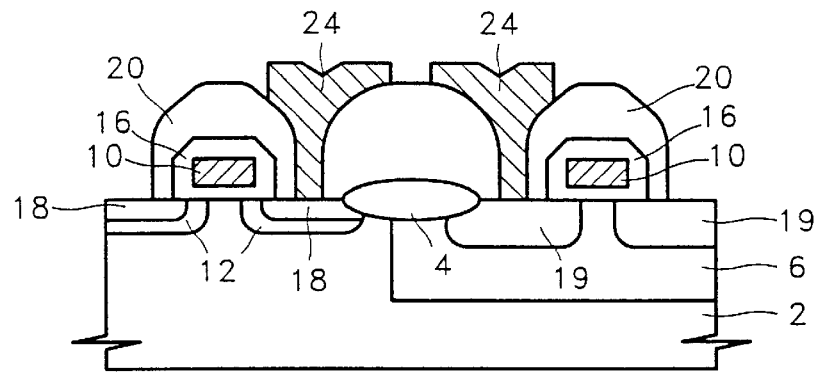
Figure 3:
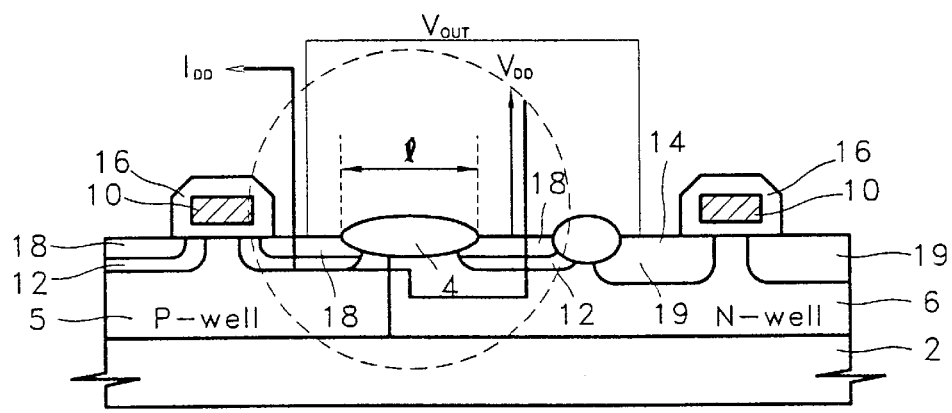
FIG. 3 is a cross-sectional view showing the $N^-$ source/drain of a conventional CMOS transistor and the N-well thereof which may cause improper operation.
Figure 3A:
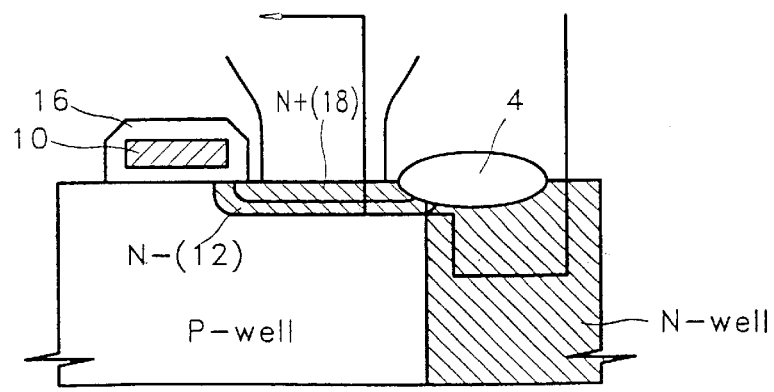
FIG. 3a is an enlarged view of the marked portion shown in FIG. 3.
Figure 4:
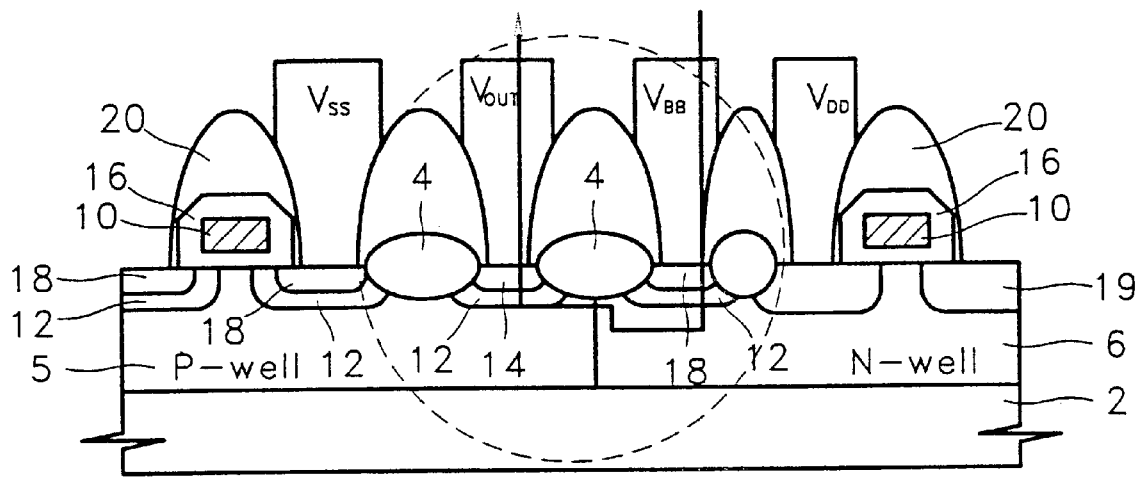
FIG. 4 is a cross-sectional view showing misalignment of the $P^+$ source/drain which may cause improper device operation.
Figure 4A:
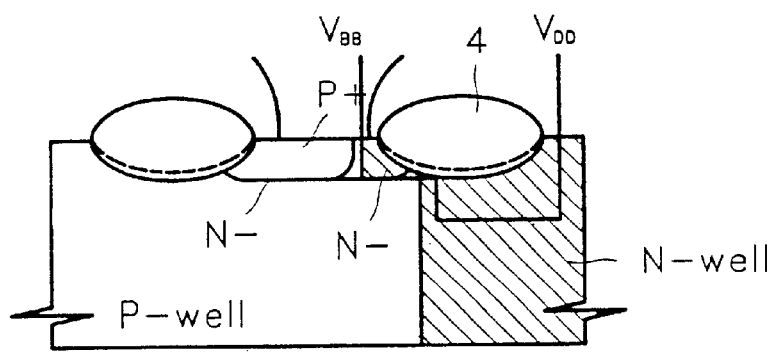
FIG. 4a is a enlarged view of the marked portion shown in FIG. 4.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

Figure 5:
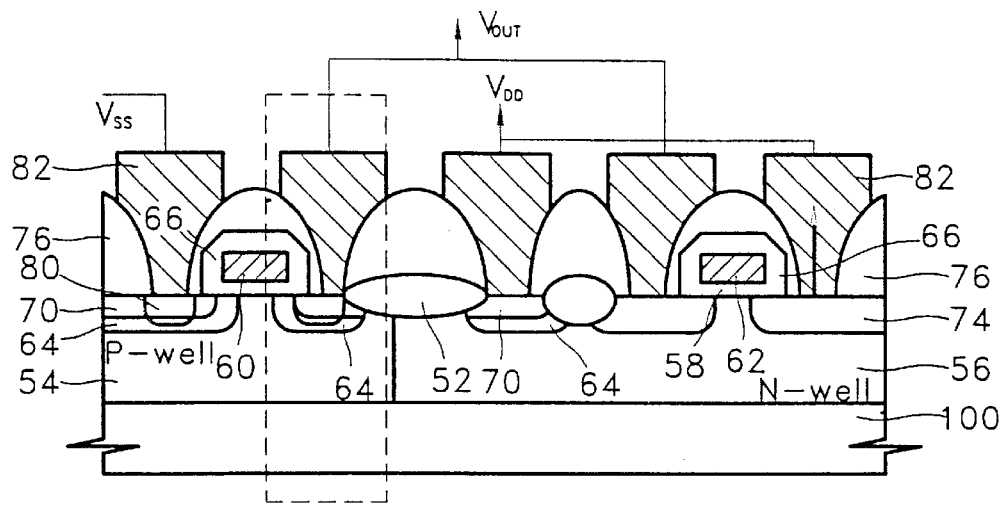
FIG. 5 is a cross-sectional view of CMOS integrated circuits according to an embodiment of the present invention.

FIG. 5 is a cross-sectional view of a CMOS integrated circuit according to an embodiment of the present invention. Reference numerals 100 and 52 denote an integrated circuit substrate such as a semiconductor substrate, and a field oxide which separates integrated circuit devices, respectively. Reference numerals 54 and 56 denote a P-well for an NMOS transistor and an N-well for a PMOS transistor, respectively. Reference numerals 58, 60 and 62 denote a gate insulating layer, a gate electrode of an NMOS transistor, and a gate electrode of a PMOS transistor, respectively. Reference numerals 64, 70 and 74 denote an $N^-$ source/drain, an $N^+$ source/drain, and a $P^+$ source/drain, respectively. Reference numerals 66 and 76 denote inter-layer insulating layers. Reference numerals 80 and 82 denote a P-plug and a wiring layer, respectively.

The P-well 54 and the N-well 56 are formed on the semiconductor substrate 100 which is separated into adjacent active and inactive regions by the field oxide 52. The NMOS gate electrode 60 and the PMOS gate electrode 62 are formed on the substrate, with the gate insulating layer 58 therebetween.

The LDD $N^-$ source/drain 64 and $N^+$ source/drains 70 are formed on opposing sides of the NMOS transistor gate electrode 60, and $P^+$ source/drains 74 are formed on opposing sides of the PMOS transistor gate electrode 62. On the source/drains 64 and 74 of the NMOS and PMOS transistors, respectively, contact holes are formed by selectively etching the inter-layer-insulating layer 76. Wiring layer 82 fills the contact holes.

Figure 6:
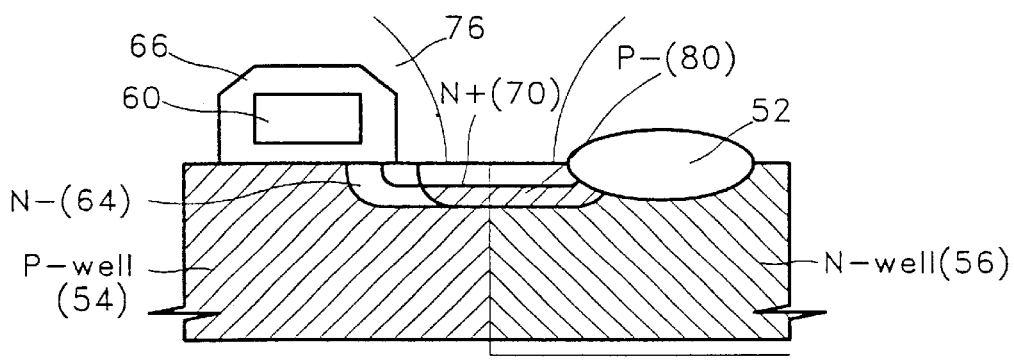
FIG. 6 is a enlarged view of the marked portion shown in FIG. 5.

FIG. 6 shows an enlarged view of the NMOS source/drain, $N^-$, $N^+$ and $P^-$ impurity layers 64, 70 and 80, respectively, which sequentially extend from the channel beneath the gate electrode 60. The $P^-$ plug 80 is preferably formed to completely shield the $N^-$ source/drain 64 from the N-well 56. The wiring layer 82, shown in FIG. 5, is isolated from the NMOS gate electrode 60 by a predetermined distance, and is close to the field oxide 52.

A concentration of $1.0 \times 10^{13} \sim 5.0 \times 10^{13}$ ions/cm$^2$ of N-type impurities, e.g., phosphorous ions (P), preferably is implanted into the $N^-$ source/drain 64. A concentration of $1.0 \times 10^{15} \sim 5.0 \times 10^{15}$ ions/cm$^2$ of arsenic ions (As) preferably is implanted into the $N^+$ source/drain 70. P-type ions having one and one half the concentration of the impurities in the $N^-$ source/drain 64 preferably are implanted into the $P^+$ plug 80.

In a CMOS integrated circuit according to an embodiment of the present invention, the $N^-$ source/drain 64 adjacent to the N-well may be completely shielded by the $P^-$ plug 80. Thus, even though the impurities in the $N^-$ source/drain 64 and the N-well 56 may be diffused by a subsequent thermal annealing process, or the $P^+$ source/drain is misaligned, the $N^-$ source/drain 64 and the N-well 56 need not contact one another. Thus, improper operation of the CMOS devices can be reduced or prevented. The reliability of the devices thus may be improved.

The present invention need not only be applied to a $P^-$ plug 80 for shielding the Nsource/drain 64 adjacent to the N-well, as shown in above embodiment. Rather, the present invention may also be applied to the complementary case. That is, an $N^-$ plug may shield a $P^+$ source/drain. Also, plugs having reversed $N^-$ and $P^+$ regions on both sides of the NMOS and PMOS transistors may also be used according to the present invention.

FIGS. 7A through 7F are cross-sectional views showing a fabrication process for CMOS integrated circuits according to an embodiment of the present invention.

Figure 7A:
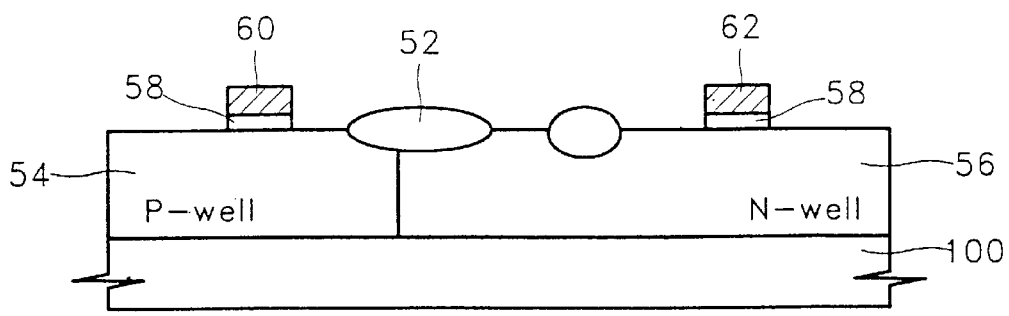
FIGS. 7A through 7F are cross-sectional views showing a manufacturing process for CMOS integrated circuits according to an embodiment of the present invention.

FIG. 7A shows the step of forming the field oxide 52 and the gate electrodes 60 and 62. In particular, a field oxide defining the active regions is formed on the surface of the semiconductor substrate 100. Then, the P-well 54 and N-well 56 are formed. The gate insulating layer 58 is formed thereon. A gate conductive layer is formed on the gate insulating layer 58. Finally, gate electrodes 60 and 62 are formed by patterning the gate conductive layer and the gate insulating layer 58.

In more detail, a field oxide 52, about 1,000~5,000 Å thick, for separating the active and inactive regions, is formed on the substrate 100 using a conventional semiconductor device isolating process such as LOCal Oxidation of Silicon (LOCOS). Then, P-type impurities are implanted in a predetermined region of the substrate using conventional photolithography and ion implantation. Then, the impurities are diffused to a certain depth by a high-temperature treatment. Thus, the P-well 54 is formed. The N-well 56 is formed by implanting N-type impurities using the same process.

The gate insulating layer 58 is formed by growing a thin thermal oxide layer to a thickness of about 60~200 Å, on the substrate. The gate electrodes of the NMOS and PMOS transistors are formed by depositing an impurity doped-polysilicon layer on the gate insulating layer 58, and anisotropically etching the polysilicon layer and gate insulating layer 58.

Figure 7B:
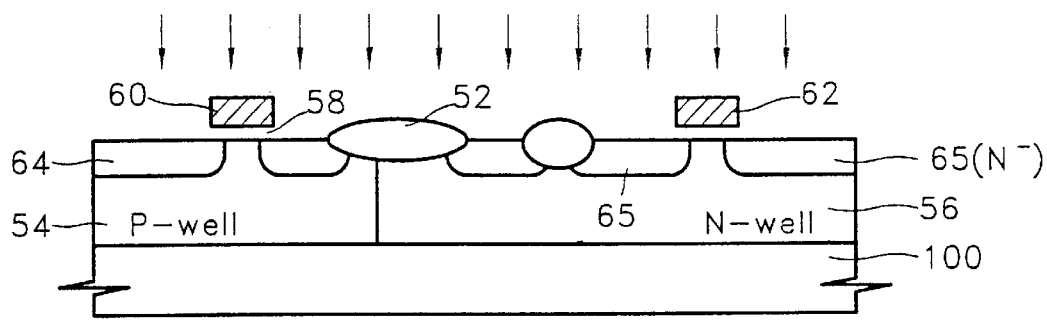

FIG. 7B shows a step of implanting ions to form the N$^-$ source/drain 64. In more detail, the N$^-$ source/drain 64 is formed by implanting a concentration of $1.0 \times 10^{13}$~$5.0 \times 10^{13}$ ions/cm$^2$ of N$^-$-type impurities, e.g., phosphorous ions, at an implantation energy of 20 KeV~60 KeV. Normally, this step is not limited to the NMOS transistor area, in order to reduce the number of process steps. As a result, N$^-$ region 65 of the N-well can suppress short channel effects in the PMOS transistor.

The N$^-$ source/drain 64 can be formed in the NMOS region by photolithography. However, when N$^-$ impurities are implanted into the surface of the NMOS and PMOS transistors and then the P$^+$ source/drain is formed later, short channel effects in the PMOS transistor can be reduced.

Figure 7C:
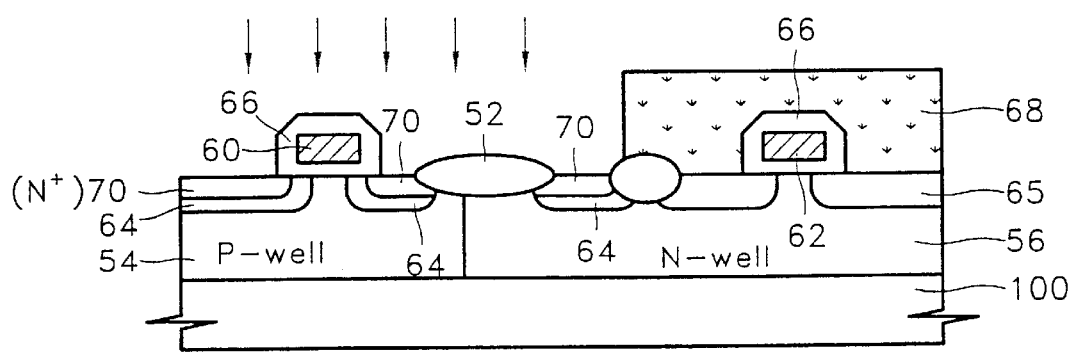

FIG. 7C shows the step of forming the inter-layer insulating layer 66 and the N$^+$ source/drain 70. The inter-layer insulating layer 66 is formed, surrounding the gate electrodes 60 and 62. A first photoresist pattern is formed to expose the NMOS device and partially expose the N-well. The N$^+$ source/drain 70 is formed by implanting impurity ions into the NMOS device.

In more detail, the inter-layer insulating layer 66 is formed by depositing an insulating material such as a high temperature oxide (HTO), and anisotropically etching. The first photoresist pattern 68 for exposing the NMOS device and partially exposing the N-well, is formed by depositing a photoresist on the inter-layer insulating layer 66 and performing mask exposure and development. Afterwards, the N$^+$ source/drain 70 is formed by implanting N-type impurities, e.g. arsenic ions having a concentration of $1.0 \times 10^{15}$~$5.0 \times 10^{15}$ ions/cm$^2$ at an implant energy level of 20 KeV~60 KeV, into the exposed NMOS device of the P-well and into the partial region of N-well, using the first photoresist pattern 68 as a mask.

Figure 7D:
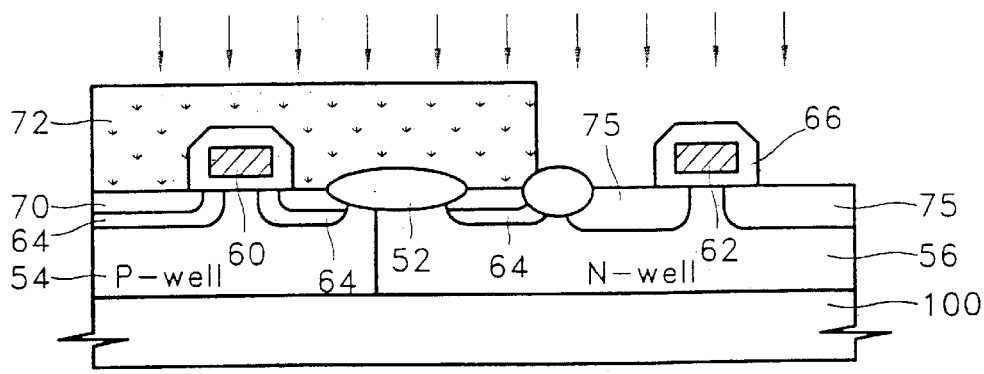

FIG. 7D shows the step of forming the P$^+$ source/drain. The first photoresist pattern 68 is removed. A second photoresist pattern 72 is formed, exposing the PMOS device using photolithography. The P$^+$ source/drain is formed by ion-implantation.

In more detail, the first photoresist pattern 68 (see FIG. 7C) is removed. A second photoresist is deposited on the area that was not covered by the first photoresist pattern 68. A mask exposure and developing process is performed, and, as a result, the second photoresist pattern 72, exposing the PMOS device, is formed. Afterwards, P-type impurities, e.g. difluoric boride (BF$_2$) having a concentration of $1.0 \times 10^{15}$~$5.0 \times 10^{15}$ ions/cm$^2$, are implanted at an implant energy level of 20 KeV~60 KeV. As a result, the N$^-$ impurity in the PMOS device is compensated completely, and thus the P$^+$ source/drain 74 is formed. Next, annealing is performed at 800–900° C. to activate the impurities in the N$^+$ source/drain 70 and the P$^+$ source/drain 74.

Figure 7E:
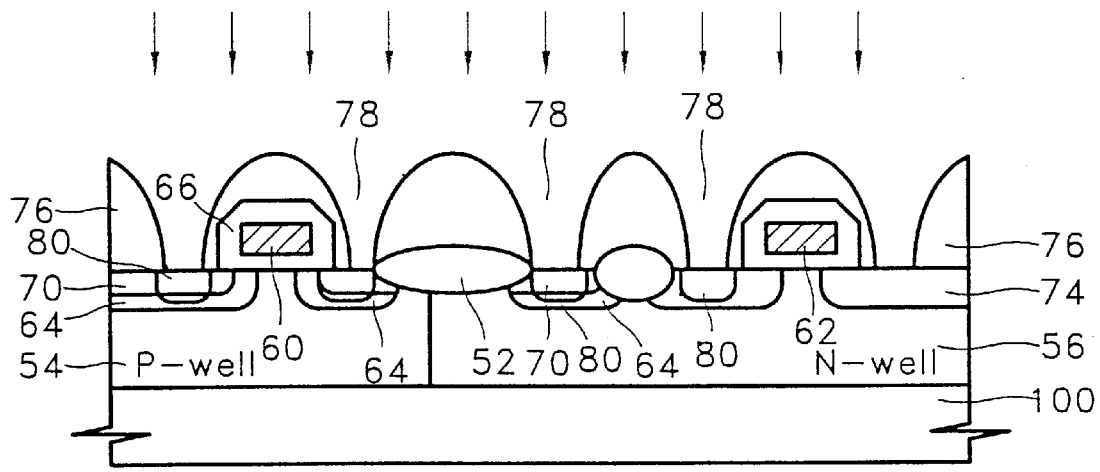

FIG. 7E shows the contact hole forming step and the plug ion implanting step. The second photoresist pattern 72 is removed. A second inter-layer insulating layer 76 is formed. The contact holes 78 are formed, and the plug ions are implanted.

In more detail, the inter-layer insulating layer 76 is formed by removing the second photoresist 72 and depositing an insulating material such as a high temperature oxide (HTO). The contact holes 78 for connecting the active domain on the substrate and the wiring layer are formed by partially etching the inter-layer insulating layer 76 using conventional photolithography. Then, the P$^-$ plugs 80 are formed in the exposed portions of the P-well and N-well by implanting P$^-$ type impurities, e.g. difluoric boride (BF$_2$) or boron ions, therein through the contact holes 78. It will be understood that the ion implantation for forming the P$^-$ plugs can be performed only in the NMOS device by shielding the PMOS device using a mask.

The impurity ion concentration for forming the P$^-$ plug is preferably about 1.5 times that of the impurities implanted into the N$^-$ source/drain 64. Also preferably, the contact hole 78 is formed to be spaced apart from the gate electrode 60 by a predetermined distance and close to the field oxide 52. Thus, the NMOS source/drain can be formed as an LDD structure extending from the gate electrode 60, and the P-plug 80 can shield the N$^-$ source/drain 64 completely. The N$^-$ source/drain 64 thereby is prevented from contacting N-well 56.

Figure 7F:
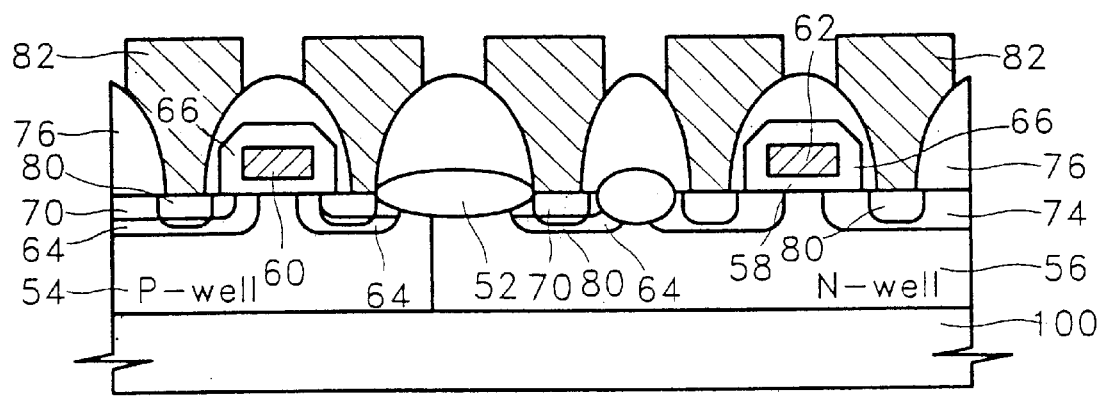

FIG. 7F shows the step of forming the wiring layer 82. In more detail, an annealing or a rapid thermal process (RTP) at 450~900° C. is performed to diffuse the impurities implanted into the P$^-$ plug 80. Afterwards, the wiring layer 82 is formed by depositing and patterning a wiring metal such as aluminum (Al). Thus, the CMOS device is formed.

It will be understood that the above-described embodiment of the present invention forms the P$^-$ plug in the source/drain of the NMOS transistor. However, the present invention can be applied to other cases. For example, N$^-$ plugs can be formed in the source/drain of the PMOS transistor, or plugs having opposite conductivities to the impurities in the NMOS and PMOS source/drain can be formed therein.

As described above, the present invention can reduce and preferably overcome problems of the prior art by forming plugs having the opposite polarities in at least one source/drain between the NMOS and PMOS transistors, to prevent the source/drain from contacting to the adjacent well. For example, if a P$^-$ plug shields the N$^+$ source/drain adjacent the N-well, even though the impurities in the source/drain or in the adjacent well are diffused, or misalignment of the active domain occurs, the source/drain and the well need not contact each other. Malfunction of semiconductor devices can be prevented.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A CMOS integrated circuit comprising:
   an integrated circuit substrate;
   an NMOS transistor and a PMOS transistor in the integrated circuit substrate, the NMOS transistor and the PMOS transistor each including a gate, and a source/drain on opposing sides of the gate;
   an insulating layer on the integrated circuit substrate, the insulating layer including a first contact hole therein, the first contact hole exposing a portion of a first one of the source/drains, the insulating layer also including a second contact hole therein, the second contact hole exposing a portion of a second one of the source/drains of opposite conductivity type from the first one of the source/drains;

a first source/drain plug in the first one of the source/drains, of opposite conductivity type from the first one of the source/drains and located in the first one of the source/drains so as to shield the first one of the source/drains from an adjacent well in the integrated circuit substrate, which contains the second one of the source/drains and which is of same conductivity type as the first one of the source/drains;

a first wiring layer in the contact hole, electrically connected to the first source/drain plug; and a second wiring layer in the second contact hole, electrically connected to the second one of the source/drains.

2. A CMOS integrated circuit according to claim 1 wherein the first one of the source/drains and the second one of the source/drains comprise a source region and a drain region, respectively, of the NMOS transistor or the PMOS transistor.

3. A CMOS integrated circuit according to claim 1 wherein the first one of the source/drains and the second one of the source/drains comprise a source/drain of the NMOS transistor and a source/drain of the PMOS transistor, respectively.

4. A CMOS integrated circuit according to claim 1 wherein the first one of the source/drains comprises a first source/drain, and a second source/drain within the first source/drain. wherein the first and second source/drains are doped same conductivity type, and wherein the first source/drain is lightly doped, relative to the second source/drain.

5. A CMOS integrated circuit according to claim 1 wherein the first one of the source/drains is a source/drain of the NMOS transistor, and wherein the first source/drain plug is a P-type source/drain plug.

6. A CMOS integrated circuit according to claim 5 wherein the source/drain of the NMOS transistor comprises an N$^-$-type source/drain, an N$^+$-type source/drain within the N$^-$-type source/drain, and the P-type source/drain plug within the N$^+$-type source/drain.

7. A CMOS integrated circuit according to claim 6 wherein the N$^-$-type source/drain has an impurity concentration of between $1.0 \times 10^{13}$ and $5.0 \times 10^{13}$ ions/cm$^2$, and wherein the P-type source/drain plug has an impurity concentration of 1.5 times that of the N$^-$-type source/drain.

8. A CMOS integrated circuit according to claim 1, further comprising a second well in the integrated circuit substrate, wherein the first one of the source/drains is contained in the second well, the second well and the first one of the source/drains being of opposite conductivity type.

9. A CMOS integrated circuit comprising:

an integrated circuit substrate;

an NMOS transistor and a PMOS transistor in the integrated circuit substrate, the NMOS transistor and the PMOS transistor each including a gate, and a source/drain on opposing sides of the gate;

an insulating layer on the integrated circuit substrate, the insulating layer including a first contact hole therein, the first contact hole exposing a portion of a first one of the source/drains, the insulating layer also including a second contact hole therein, the second contact hole exposing a portion of a second one of the source/drains of opposite conductivity type from the first one of the source/drains;

a first source/drain plug in the first one of the source/drains, of opposite conductivity from the first one of the source/drains and located in the first one of the source/drains so as to shield the first one of the source/drains from an adjacent well in the integrated circuit substrate, which contains the second one of the source/drains and which is of same conductivity type as the first one of the source/drains;

a first wiring layer in the contact hole electrically connected to the first source/drain plug;

a second source/drain plug in the second one of the source/drains, of same conductivity type as the second one of the source/drains; and a second wiring layer in the second contact hole, electrically connected to the second source/drain plug.

10. A CMOS integrated circuit according to claim 9 wherein the first one of the source/drains and the second one of the source/drains comprise a source region and a drain region, respectively, of the NMOS transistor or the PMOS transistor.

11. A CMOS integrated circuit according to claim 9 wherein the first one of the source/drains and the second one of the source/drains comprise a source/drain of the NMOS transistor and a source/drain of the PMOS transistor, respectively.

12. A CMOS integrated circuit according to claim 9 wherein the first one of the source/drains comprises a first source/drain, and a second source/drain within the first source/drain, wherein the first and second source/drains are doped same conductivity type, and wherein the first source/drain is lightly doped, relative to the second source/drain.

13. A CMOS integrated circuit according to claim 9 wherein the first one of the source/drains is a source/drain of the NMOS transistor, and wherein the first source/drain plug is a P-type source/drain plug.

14. A CMOS integrated circuit according to claim 13 wherein the source/drain of the NMOS transistor comprises an N$^-$-type source/drain, an N$^+$-type source/drain within the N$^-$-type source/drain, and a P-type source/drain plug within the N$^+$-type source/drain.

15. A CMOS integrated circuit according to claim 14 wherein the N$^-$-type source/drain has an impurity concentration of between $1.0 \times 10^{13}$ and $5.0 \times 10^{13}$ ions/cm$^2$, and wherein the P-type source/drain plug has an impurity concentration of 1.5 times that of the N$^-$-type source/drain.

16. A CMOS integrated circuit according to claim 9 further comprising a second well in the integrated circuit substrate, wherein the first one of the source/drains is contained in the second well, the second well and the first one of the source/drains being of opposite conductivity type.

17. A CMOS integrated circuit comprising:

an integrated circuit substrate;

an NMOS transistor and a PMOS transistor in the integrated circuit substrate, the NMOS transistor and the PMOS transistor each including a gate, and a source/drain on opposing sides of the gate;

an insulating layer on the integrated circuit substrate, the insulating layer including a first contact hole therein, the first contact hole exposing a portion of a first one of the source/drains, the insulating layer also including a second contact hole therein, the second contact hole exposing a portion of a second one of the source/drains of opposite conductivity type from the first one of the source/drains;

a first source/drain plug in the first one of the source/drains, of opposite conductivity type from the first one of the source/drains and located in the first one of the source/drains so as to shield the first one of the source/ drains from an adjacent well in the integrated circuit substrate, which contains the second one of the source/drains and which is of same conductivity type as the first one of the source/drains;

a first wiring layer in the contact hole, electrically connected to the first source/drain plug;

a second source/drain plug in the second one of the source/drains, of opposite conductivity type from the second one of the source/drains; and a second wiring layer in the second contact hole, electrically connected to the second source/drain plug.

18. A CMOS integrated circuit according to claim 17 wherein the first one of the source/drains and the second one of the source/drains comprise a source region and a drain region, respectively, of the NMOS transistor or the PMOS transistor.

19. A CMOS integrated circuit according to claim 17 wherein the first one of the source/drains and the second one of the source/drains comprise a source/drain of the NMOS transistor and a source/drain of the PMOS transistor, respectively.

20. A CMOS integrated circuit according to claim 17 wherein the first one of the source/drains comprises a first source/drain, and a second source/drain within the first source/drain, wherein the first and second source/drains are doped same conductivity type, and wherein the first source/drain is lightly doped, relative to the second source/drain.

21. A CMOS integrated circuit according to claim 17 wherein the first one of the source/drains is a source/drain of the NMOS transistor, and wherein the first source/drain plug is a P-type source/drain plug.

22. A CMOS integrated circuit according to claim 21 wherein the source/drain of the NMOS transistor comprises an $N^-$-type source/drain, an $N^+$-type source/drain within the $N^-$-type source/drain, and a P-type source/drain plug within the $N^+$-type source/drain.

23. A CMOS integrated circuit according to claim 22 wherein the $N^-$-type source/drain has an impurity concentration of between $10 \times 10^{13}$ and $5.0 \times 10^{13}$ ions/cm$^2$, and wherein the P-type source/drain plug has an impurity concentration of 1.5 times that of the $N^-$-type source/drain.

24. A CMOS integrated circuit according to claim 17 further comprising a second well in the integrated circuit substrate, wherein the first one of the source/drains is contained in the second well, the second well and the first one of the source/drains being of opposite conductivity type.

\* \* \* \* \*

UNITED STATES PATENT AND TRADEMARK OFFICE
CERTIFICATE OF CORRECTION

PATENT NO. : 6,274,914 B1
DATED : August 14, 2001
INVENTOR(S) : Park et al.

It is certified that error appears in the above-identified patent and that said Letters Patent is hereby corrected as shown below:

Title page,
Item [56], References Cited, U.S. PATENT DOCUMENTS, please add:
-- 3,961,357    6/1976    Okuhara et al.    357/50
   5,684,319   11/1997    Hebert             257/336 --.

Column 9,
Line 29, please delete "." following "source/drain".

Column 12,
Line 15, please change "$10x10^{13}$" to -- $1.0x10^{13}$ --.

Signed and Sealed this

Eleventh Day of October, 2005

JON W. DUDAS
*Director of the United States Patent and Trademark Office*